United States Patent [19]
New

[11] Patent Number: 6,133,108
[45] Date of Patent: Oct. 17, 2000

[54] DIELECTRIC ETCH PROTECTION USING A PRE-PATTERNED VIA-FILL CAPACITOR

[75] Inventor: Daryl C. New, Meridian, Id.

[73] Assignee: Micron Technology, Inc., Boise, Id.

[21] Appl. No.: 09/113,743

[22] Filed: Jul. 10, 1998

Related U.S. Application Data

[60] Division of application No. 08/650,915, May 17, 1996, Pat. No. 5,801,916, which is a continuation-in-part of application No. 08/559,186, Nov. 13, 1995, Pat. No. 5,631,804.

[51] Int. Cl.[7] .................................................. H01L 21/20
[52] U.S. Cl. ........................................ 438/396; 438/386
[58] Field of Search ................................ 438/396, 3, 386

[56] References Cited

U.S. PATENT DOCUMENTS

| | | | |
|---|---|---|---|
| 4,145,803 | 3/1979 | Tasch, Jr. ............................... | 438/250 |
| 4,481,283 | 11/1984 | Kerr et al. ............................. | 430/319 |
| 4,890,191 | 12/1989 | Rokos ..................................... | 361/313 |
| 5,053,917 | 10/1991 | Miyasaka et al. ................... | 361/321.5 |
| 5,099,305 | 3/1992 | Takenaka ............................... | 257/295 |
| 5,187,638 | 2/1993 | Sandhu et al. ....................... | 361/313 |
| 5,227,855 | 7/1993 | Momose ................................. | 365/145 |
| 5,293,510 | 3/1994 | Takenaka ............................... | 257/295 |
| 5,349,494 | 9/1994 | Ando ..................................... | 361/322 |
| 5,366,920 | 11/1994 | Yamanichi et al. .................. | 438/396 |
| 5,369,296 | 11/1994 | Kato ...................................... | 257/295 |
| 5,424,238 | 6/1995 | Sameshima ........................... | 438/3 |
| 5,443,688 | 8/1995 | Toure et al. .......................... | 438/3 |
| 5,452,178 | 9/1995 | Emesh et al. ........................ | 361/303 |
| 5,495,117 | 2/1996 | Larson .................................. | 257/295 |
| 5,563,762 | 10/1996 | Leung et al. ......................... | 361/301.4 |
| 5,595,928 | 1/1997 | Lu et al. ............................... | 438/253 |
| 5,612,082 | 3/1997 | Azuma et al. . | |
| 5,631,804 | 5/1997 | New ...................................... | 257/295 |
| 5,686,339 | 11/1997 | Lee et al. .............................. | 257/306 |
| 5,879,982 | 3/1999 | Park et al. ............................ | 438/241 |
| 5,930,639 | 7/1999 | Schuele et al. ...................... | 438/396 |
| 5,940,676 | 8/1999 | Fazan et al. .......................... | 438/3 |

OTHER PUBLICATIONS

Wolf and Tauber, Silicon Processing for the VLSI Era, vol. 1—Process Technology, Lattice Press, pp. 191–194, 1986.

*Primary Examiner*—Charles Bowers
*Assistant Examiner*—Evan Pert
*Attorney, Agent, or Firm*—Knobbe Martens Olson & Bear, LLP

[57] ABSTRACT

Disclosed is a capacitor incorporating a material having a high dielectric constant and a method of fabricating the same. In a preferred embodiment, the bottom electrode is first deposited and patterned. An insulating diffusion barrier, such as LPCVD silicon nitride, is deposited over the bottom electrode and a via is opened in the silicon nitride to expose the bottom electrode. This via is filled with the dielectric material. In a disclosed embodiment, the dielectric material is deposited in solution form and crystallized in a high-temperature step. A top conductive layer is deposited over the dielectric material, masked and etched to form the top conductive layer. This etch may simultaneously etch any portion of the dielectric layer overflowing the contact via.

26 Claims, 3 Drawing Sheets

DIELECTRIC ETCH PROTECTION USING A PRE-PATTERNED VIA-FILL CAPACITOR

CROSS-REFERENCE TO RELATED APPLICATIONS

The present application is a division of application Ser. No. 08/650,915 filed May 17, 1996 (now U.S. Pat. No. 5,801,916) which is a continuation-in-part of U.S. patent application of Daryl C. New, entitled "Pre-Patterned Contact Fill Capacitor for Dielectric Etch Protection," having Ser. No. 08/559,186, filed Nov. 13, 1995, (now U.S. Pat. No. 5,631,804) and assigned to the assignee of the present application.

FIELD OF THE INVENTION

The present invention relates to capacitors within an integrated circuit, and more particularly, to capacitors employing materials having high dielectric constants for the capacitor dielectric between two electrodes.

BACKGROUND OF THE INVENTION

Recent advances in the miniaturization of integrated circuits have led to smaller chip areas available for devices. High density dynamic random access memory chips (DRAMs), for example, leave little room for the storage node of a memory cell. Yet, the storage node (capacitor) must be able to store a certain minimum charge, determined by design and operational parameters, to ensure reliable operation of the memory cell. It is thus increasingly important that capacitors achieve a high stored charge per unit of chip area occupied.

Traditionally, capacitors integrated into memory cells have been patterned after the parallel plate capacitor. A layer of dielectric is deposited between the deposition of two conductive layers and the layers are patterned, either sequentially during deposition or all at once. The patterned dielectric becomes a capacitor dielectric while the patterned conductive layers become the top and bottom plates or electrodes of the resultant capacitor structure. The amount of charge stored on the capacitor is proportional to the capacitance, $C=\epsilon\epsilon_0 A/d$, where $\epsilon$ is the dielectric constant of the capacitor dielectric, $\epsilon_0$ is the vacuum permittivity, A is the electrode area and d is the spacing between electrodes.

Several techniques have recently been developed to increase the total charge capacity of the cell capacitor without significantly affecting the chip area occupied by the cell. These include increasing the effective surface area of the electrodes by creating folding structures, such as trench or stacked capacitors. Such structures better utilize the available chip area by creating three dimensional shapes to which the conductive electrodes and capacitor dielectric conform. The surface area of the electrodes may be further increased by providing a roughened surface to the bottom electrode, over which the capacitor dielectric and the top electrode are conformally deposited. Other techniques concentrate on the use of new dielectric materials having higher dielectric constants ($\epsilon$).

As DRAM density has increased and memory cells are packed more closely together, the three dimensional folding structures designed to increase the electrode surface area have become complicated and expensive to fabricate. Thus, greater attention is now being given to the development of thin film dielectric materials, including ferro-electrics which yield very high capacitance relative to conventional dielectrics. Such materials effectively possess dielectric constants significantly greater than conventional dielectrics (e.g., silicon oxides and nitrides). Whereas $\epsilon=3.9$ for silicon dioxide, the dielectric constants of these new materials are generally greater than 300, and some even higher (600–800). Using such materials allows the creation of much smaller and simpler capacitor structures for a given stored charge requirement.

Among the high-$\epsilon$ or ferro-electric materials being studied, much attention has been paid to barium strontium titanate (BST), lead zirconate titanate (PZT), and strontium bismuth tantalate (SBT). However, technical difficulties have been encountered in incorporating these materials into current integrated circuits with conventional fabrication techniques. The problems with these materials have thus far prevented their use in large scale, commercial production of integrated circuits such as DRAMs or SRAMs.

For example, chemical vapor deposition (CVD) of PZT and BST is often accompanied by oxidation of polycrystalline silicon (polysilicon) electrodes. Therefore, the electrodes should advantageously comprise a noble metal, such as platinum. Nevertheless, oxygen may diffuse through the platinum bottom electrode to oxidize any silicon underlying the bottom electrode (e.g., a polysilicon plug or the silicon substrate). Although diffusion barriers may be incorporated to protect any underlying silicon from oxidation, these diffusion barriers are costly to integrate into the manufacturing process flow and are at any rate subject to breakdown during subsequent processing.

Use of ferro-electric materials introduces other special requirements for the process flows. One of the advantages of ferro-electric materials is the sharp switching characteristics of memory cells incorporating them, allowing their use in non-volatile memory applications. These switching characteristics, however, are sensitive to any variation in the thickness of the ferro-electric layer. Thus, the fabrication process should be such as to produce a ferro-electric layer of substantially uniform thickness for the capacitor dielectric.

Deposition of a high-$\epsilon$ or ferro-electric layer over a pre-patterned bottom electrode may also lead to structural defects in the resultant capacitor. In order to produce a high capacitance value, dielectric layers in general should be as thin as possible without risking short circuits, since the thickness of the dielectric layer represents the spacing between electrodes, or d in the denominator of the capacitance formula set forth above, and this is thought to be true of ferro-electric layers as well. At any rate, a thin layer will generally conform to the surface of a pre-patterned bottom electrode, including the vertical sidewalls of the bottom electrode. Curving over the bottom electrode corners may not raise problems for conventional, amorphous dielectrics such as oxides. Many high-$\epsilon$ dielectrics and ferro-electrics, however, are crystallized prior to patterning, and mechanical stresses at the corners of the bottom electrode tend to cause cracking in the dielectric layer during or after the crystallization process.

Furthermore, these new dielectric materials demonstrate chemical and physical instability under a variety of conditions common in current integrated circuit processing. For example, high temperature processes and plasma processes are known to degrade certain high-$\epsilon$ and ferro-electric materials. Very few techniques are therefore available for etching these materials without breaking down the dielectric layer and causing shorts.

Thus, a need exists for a process flow for fabricating a capacitor having a high-$\epsilon$ dielectric layer of substantially uniform thickness. Such a process flow should avoid chemical or physical breakdown of the dielectric material, or short circuiting across the capacitor electrodes.

SUMMARY OF THE INVENTION

Disclosed is a method of forming a capacitor structure within an integrated circuit. A bottom electrode is formed in an integrated circuit. The electrode is then covered with a silicon nitride layer and a contact via formed through the nitride layer to at least partially expose the bottom electrode. The dielectric material is then deposited into the contact via to contact the bottom electrode. A top electrode is then formed over the dielectric material to complete the capacitor structure.

In accordance with one aspect of the invention, the dielectric layer comprises a material having a high dielectric constant, such as strontium bismuth tantalate. This material may be spun-on the wafer to create a planar layer partially overflowing the contact via. A top conductive layer, such as platinum, is then deposited over the dielectric layer and both the top conductive layer and the overflowing dielectric layer are etched to define the top electrode and capacitor dielectric of the resultant capacitor structure.

DETAILED DESCRIPTION OF THE PREFERRED EMBODIMENT

Figure 1:
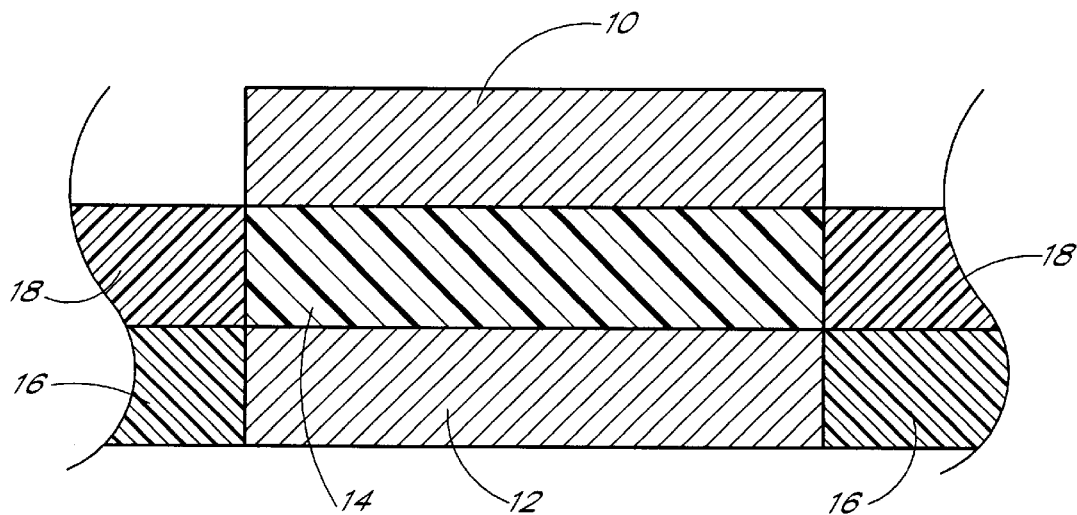
FIG. 1 is a partial schematic sectional view of an integrated circuit constructed in accordance with a planarizing process.

Due to advances in the development of high-$\epsilon$ dielectric materials for use in integrated circuits (IC), capacitors may now be created having high storage capability without complex folding structures with high surface area for the capacitor electrodes. For a given desired capacitance value, such a structure may occupy far less space than conventional capacitors which utilize silicon dioxide, for example, for the capacitor dielectric. FIG. 1, for example, illustrates one possible simple capacitor structure comprising a top electrode 10, a bottom electrode 12, and a capacitor dielectric 14 stacked one upon the other. While the capacitor dielectric 14 comprises a high-$\epsilon$ material, such as many ferro-electric materials, the electrodes 10, 12 comprise a conductive material. A non-reactive metal, such as platinum, is preferred for this material, as the electrodes 10, 12 must be in intimate contact with generally unstable high-$\epsilon$ dielectric materials.

Conceptually, the simplest method of creating a capacitor stack would be to successively deposit a first conductive layer, capacitor dielectric and second conductive layer, and then to etch through all of the above layers to define the capacitor. Such a process would achieve a planar, uniformly thick dielectric and avoid the stresses discussed in the "Background" section above. In reality, however, such a process is impractical due the fact that ion milling, which is used to etch platinum, would essentially sputter the metal during the etch and result in a metal coating of the dielectric sidewalls, thus short circuiting the capacitor. A difficult and expensive cleaning step would then be required to remove the metal from the dielectric sidewall surfaces, and such a cleaning step risks damaging the dielectric itself. Furthermore, ion milling is a species of plasma etch, which has been observed to cause chemical degradation of high-$\epsilon$ dielectrics, converting such materials to conductive material, as will be discussed in more detail below.

On the other hand, combining other conventional integrated circuit fabrication techniques with new high-$\epsilon$ dielectric materials, and especially high-$\epsilon$ ferro-electric materials, could raise problems of structural defects (cracking) in the dielectric layer and breakdown of the capacitor's switching characteristics, as discussed the "Background" section above. These problems could be addressed by depositing a planarizing oxide surrounding the pre-patterned bottom electrode, by which process a CVD oxide film is deposited and etched back to expose the top surface of the bottom electrode.

FIG. 1 illustrates a capacitor which might be fabricated by such a planarizing process. A first planarizing oxide 16 would be deposited to fill the gaps between various bottom electrodes 12 (only one of which is shown in FIG. 1) patterned on a wafer, and then etched back to provide a smooth upper surface for the integrated circuit while leaving a top surface of each bottom electrode 12 exposed. A high-$\epsilon$ dielectric layer would then be deposited over the bottom electrode 12 and first planarizing oxide 16. SBT, for example, may be deposited by a spin-on technique. Because the first planarizing oxide 16 together with the bottom electrode 12 provide a level surface, the dielectric layer would have a uniform thickness. As a consequence, a memory cell constructed by this process should have sharp switching characteristics. The dielectric layer would then be etched by a plasma process to form the capacitor dielectric 14. The capacitor dielectric 14 should likewise be surrounded by a second layer of planarizing oxide 18 to prevent cracking in a top conductive layer to be deposited next, and to prevent the top conductive layer from contacting the bottom electrode 12. The top conductive layer would then be patterned and etched to form the top electrode 10.

The multiple planarizing layers 16, 18 and the mask steps required for each layer, however, would add to the fabrication cost of the integrated circuit while increasing the chance of misalignment during one of the mask steps. Furthermore, etching through the thickness of the high-$\epsilon$ dielectric layer, as required by the planarization process described above for forming the capacitor dielectric, would remain problematic.

Many high-$\epsilon$ dielectric materials currently being studied are species of complex oxides. One form of strontium bismuth tantalate (SBT, commonly known as $Y_1$), for example, has the chemical formula $SrBi_2Ta_2O_9$. SBT has been observed to provide electrical paths or short circuits between the electrodes after exposure to plasma processes. Plasma enhanced CVD (PECVD) methods are commonly used for low temperature depositions, and plasma etching is one of the few known techniques for patterning the dielectric itself. PECVD and plasma etching are used throughout integration process flows, so that exposure of the dielectric to plasma processes is difficult to avoid. SBT and other complex oxides are believed to become depleted of oxygen during these plasma processes. Such depletion leaves a metallic compound in place of the dielectric, naturally providing an electrical path between the top and bottom electrodes so that the "capacitor" may no longer function to store charge. This chemical degradation has been rectified in the past with a recovery anneal after exposure to plasma processes. The recovery anneal, however, may itself cause additional problems, including physical degradation of the dielectric and the diffusion of oxygen through the platinum bottom electrode 12 to oxidize any silicon underlying the bottom electrode 12 (e.g., a polysilicon plug or the silicon substrate).

Figure 2:
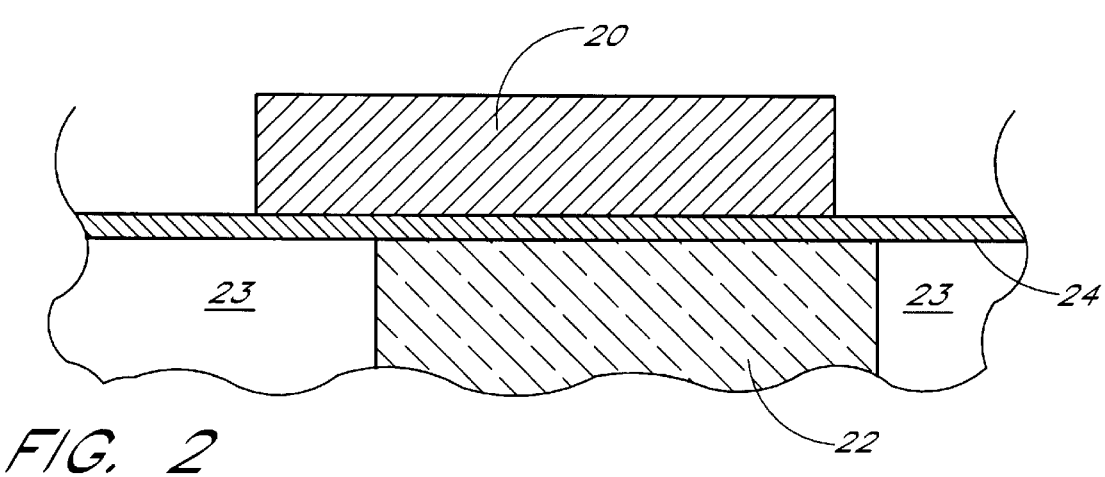
FIGS. 2 through 7 illustrate generally the method steps of the preferred embodiment of the present invention.

The preferred embodiment, described hereforth, therefore incorporates a fabrication process which not only provides for a capacitor dielectric of substantially uniform thickness, but also reduces or avoids etching of the dielectric layer. FIG. 2 illustrates a stage in the fabrication process of the preferred embodiment of the present invention. A bottom conductive layer has been deposited and patterned to form a bottom electrode 20 over a circuit node of a partially fabricated integrated circuit. The bottom electrode 20 is a conductive material preferably comprising a noble or non-reactive metal, most preferably platinum. The bottom electrode will typically be deposited by a sputter process, preferably to a thickness between 1,000 Å and 3,000 Å, most preferably about 2,000 Å. Patterning is accomplished by a standard photolithographic mask step and subsequent etch. Platinum should be etched by an ion milling process.

This bottom electrode 20 is typically electrically connected to the active area of an access device, such as a metal-oxide-semiconductor field effect transistor (MOSFET), by way of a conductive plug 22, illustrated as a polysilicon plug 22. The plug 22 is surrounded by a passivating layer 23, such as borophosphosilicate glass (BPSG), which serves to electrically isolate underlying electronic devices, as is conventional in this art. For the preferred embodiment, a conductive diffusion barrier 24 overlies the plug 22, preventing excessive diffusion of oxygen, for example, through the bottom electrode 20 to the polysilicon plug 22 of the preferred embodiment. Such a diffusion barrier may comprise titanium nitride (TiN), among other known conductive barriers, and most preferably comprises titanium aluminum nitride. The electrical connection is not central to the present invention, however, and may be replaced by any of a number of conductive structures.

Figure 3:
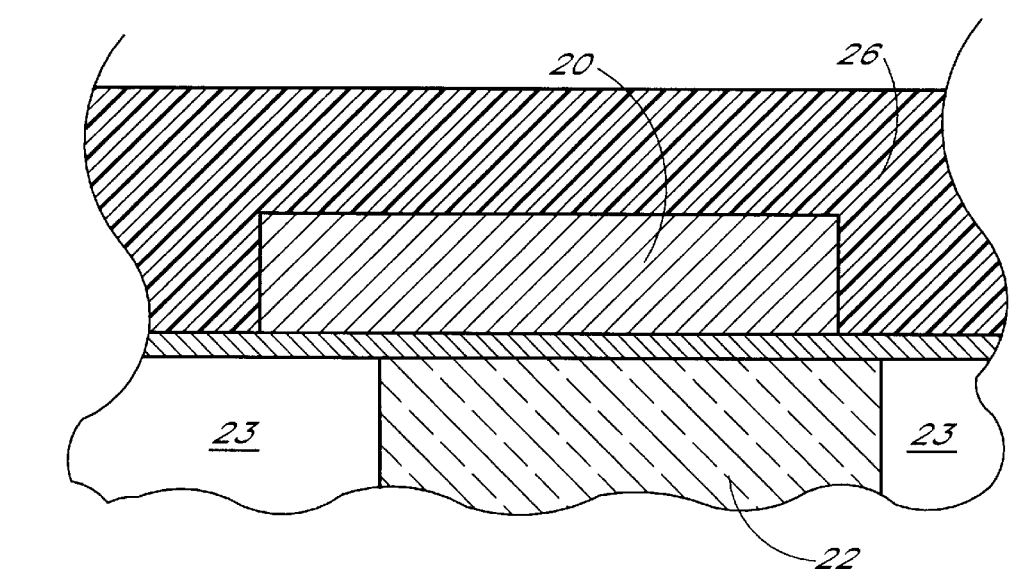

Next, an insulating layer 26 (FIG. 3) is deposited over the bottom electrode 20 and planarized. The insulating layer 26 must comprise a dielectric material to avoid short circuiting the capacitor. Furthermore, the layer 26 should serve as an effective diffusion barrier, particularly against the diffusion of oxygen. Preferably, the insulating layer comprises a silicon nitride deposited by chemical vapor deposition (CVD). For example, silane ($SiH_4$) and ammonia ($NH_3$) may be reacted at about 200° C.–350° C. in a plasma enhanced CVD (PECVD) process. Dichlorosilane ($SiCl_2H_2$) and ammonia may also be reacted at about 650° C.–750° C. in a low pressure CVD (LPCVD) process. More preferably, however, silane and ammonia are reacted in an LPCVD process between about 700° C. and 900° C., and most preferably between about 750° C. and 850° C. This preferred deposition results in a dense, stoichiometric silicon nitride layer 26, generally of the form $Si_3N_4$, as disclosed in Wolf, "Silicon Processing for the VLSI Era; Volume 1—Process Technology," at pp. 192–93.

The silicon nitride layer 26 should be thick enough after planarization to leave about 2,000–4,000 Å, and most preferably about 3,000 Å of insulating material over the bottom electrode 20. Since the bottom electrode 20 is most preferably 2,000 Å thick, the insulating layer 26 should most preferably be deposited to a post-planarization thickness of about 5,000 Å. The deposition rate may be tuned to reduce stress in the particular application, as will be understood by the skilled artisan. Planarization may be accomplished by any of a number of known means, but most preferably by a chemical-mechanical planarization (CMP).

Once the insulating layer 26 is planarized, a contact window or via 30 (FIG. 4) may be etched through the insulating layer 26 to at least partially expose an upper surface 32 of the bottom electrode 20, and most preferably the entire upper surface 32 is exposed. The etch should be performed through a reverse mask process, whereby a photoresist 33 may be defined in the negative image of the mask used to define the bottom electrode 20, as will be understood by those skilled in the art of integrated circuit fabrication. Alternatively, a second mask may be used for this contact etch.

The exposed insulating layer 26, which comprises silicon nitride (generally stoichiometric $Si_3N_4$) in the preferred embodiment, is preferably removed from above the bottom electrode 20 by a plasma etch selective against the material of the bottom electrode 20. Preferred reactive agents include fluorocarbon etchants such as $C_2F_6$, $C_3F_8$, $CF_4$ and $H_2$, $CF_4$ and $CHF_3$, or any combination of the above, in the gas phase, as will be understood by those of skill in the art of silicon processing etches. Reactor pressure should be maintained at about 150–250 mTorr, most preferably at about 200 mTorr, while the rf power should be about 500–700 W, most preferably about 600 W. The nitride of the insulating layer 26 is thus etched selectively against the platinum of the bottom electrode 20, for the present preferred embodiment. A slight overetch is desirable to ensure that all of the nitride is cleared from an upper surface 32 of the bottom electrode 20.

Figure 4:
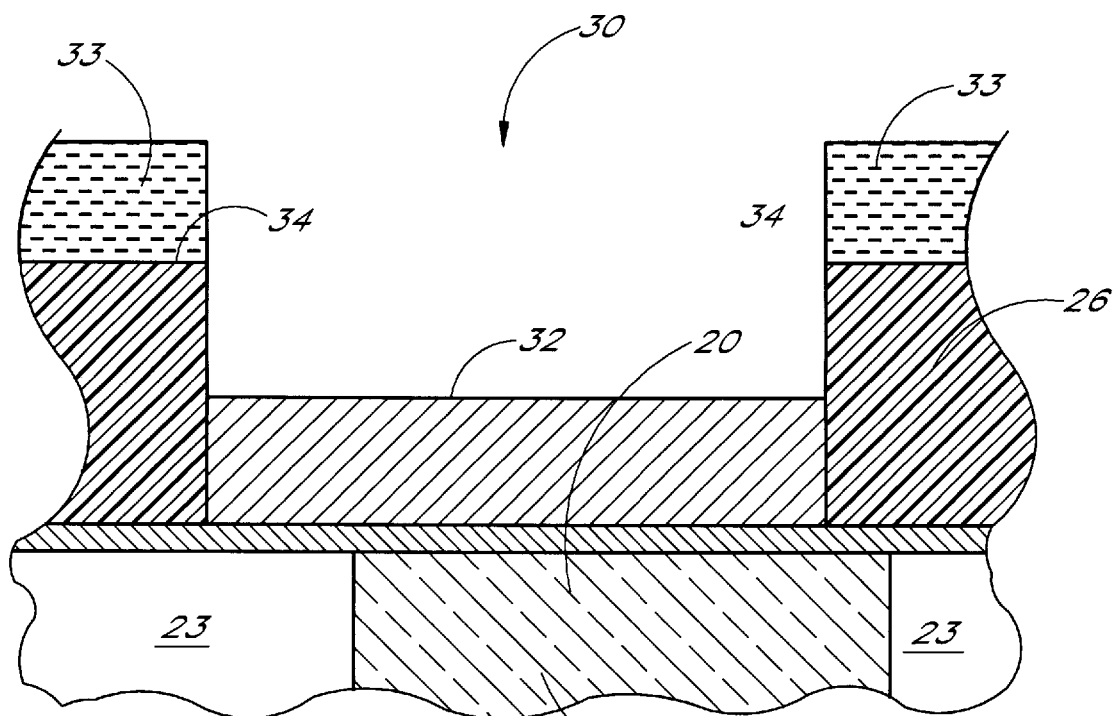

FIG. 4 illustrates the result of this contact etch. The contact window 30 extends approximately 3,000 Å from a top surface 34 of the insulating layer 26 down to the upper surface 32 of the bottom electrode 20. The photoresist overlying the insulating layer 26 should be removed by a conventional resist strip before the next process step.

Figure 5:
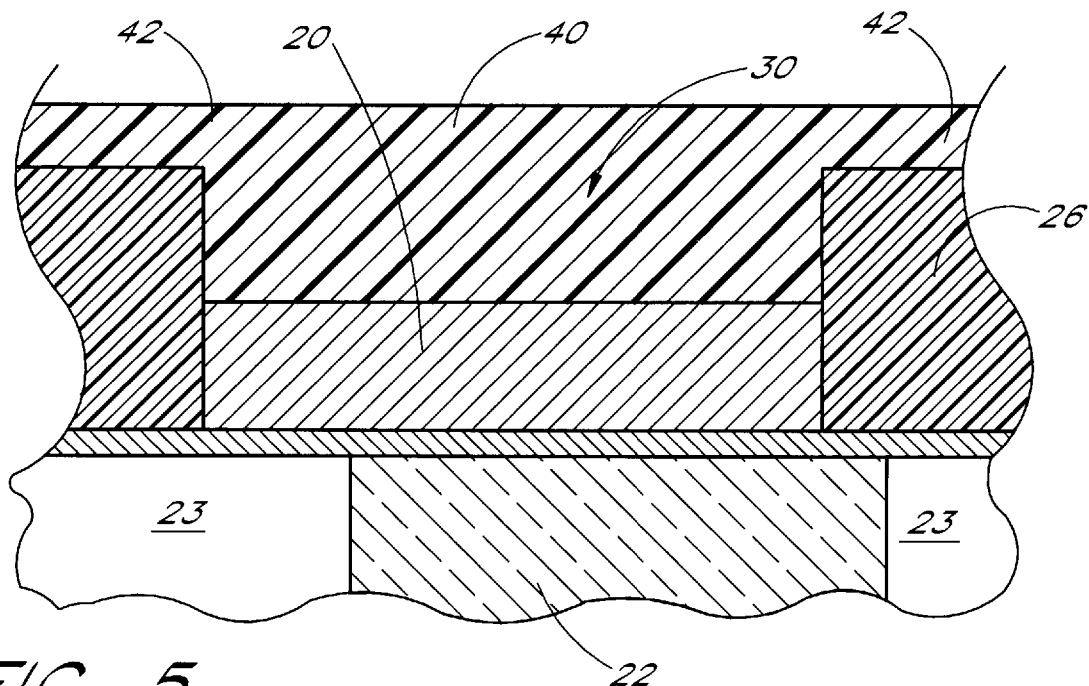

Following the resist strip, a dielectric layer 40 (FIG. 5) of the capacitor is deposited into the contact via 30, contacting the bottom electrode 20. The deposition may be accomplished by any of a number of means, depending upon the material chosen for the dielectric layer. For example, BST may be deposited by CVD processes and then planarized, as will be understood by those having skill in this art.

The dielectric layer 40 is at least partially protected from etching. That is, at least the portion of the dielectric layer 40 recessed within the contact via 30 is already patterned and need not be etched. As explained in the "Background" section, etching through high-ε dielectric materials raises a high risk of destabilizing the material and causing short circuits to form through the dielectric. In the illustrated preferred embodiment of the present invention, however, only a thin overflow portion 42 of the dielectric requires etching, while the bulk of the dielectric layer 40 is protected within the via 30 from exposure to the etch or other plasma processes. The risk of forming conductive paths through the entire dielectric layer 40 is thus significantly reduced. In alternative embodiments, no etch of the dielectric may be required as will be understood from the discussion to follow.

Preferably, the dielectric layer 40 comprises a material having a high dielectric constant (ε), specifically strontium bismuth tantalate (SBT) for the preferred embodiment. While it may also be deposited by CVD, SBT has the advantage that it is available in a solution form which allows spin-on deposition into the via 30 and over the insulating layer 26. Spin-on deposition in general is known to the art. For SBT, preferred parameters for the spin-on include wafer rotation of about 500 rpm to 5,000 rpm and an SBT solution of approximately 0.1 molar to 0.3 molar. Aside from these variables, deposition rate depends in part on the viscosity of the solution. Preferred solvents for this deposition, providing appropriate viscosities, include xylene and methoxy isopropyl alcohol (methoxy IPA). By adjusting the variables within the above-mentioned parameters, the dielectric layer 40 may be deposited to a depth between about 500 Å and 5,000 Å into the contact via 30, as will be understood by the skilled artisan. The layer 40 may be deposited in stages with multiple spin-on coats to avoid formation of stress cracks.

Most preferably, enough SBT is deposited to just fill the contact via 30 to the level of the top surface 34 of the insulating layer 40 (a depth of about 3,000 Å for the preferred embodiment). It is contemplated, however, that the dielectric layer 40 may slightly overflow the contact via 30, as illustrated. The spin-on process tends to fill low points on the wafer (including the contact via 30) first and then evenly spread out the overflow portion 42 of the dielectric layer 40 by centrifugal force, thus leaving a planar dielectric layer 40 of substantially uniform thickness. The overflow portion 42 may have a thickness of between about 0 Å to about 1,000 Å over the top surface 34 of the insulating layer 26. Alternatively, the dielectric layer 40 may slightly underfill the contact via 30 by a similar amount, though such a configuration is not illustrated.

Once deposited in solution form, the SBT of the preferred dielectric layer 40 should be crystallized. In one or more solvent evolution steps, the layer 40 may be baked, preferably between about 100° C. and 550° C. Following solvent evolution a higher temperature crystallization step is performed, preferably between about 450° C. and 950° C. This crystallization of a complex oxide such as SBT should be performed in an oxygen ambient. During this high temperature oxidation step, oxygen tends to diffuse outward from the dielectric layer 40. Due, however, to the dense silicon nitride of the insultating layer 26, damage to the circuit from oxidation is minimized.

Figure 6:
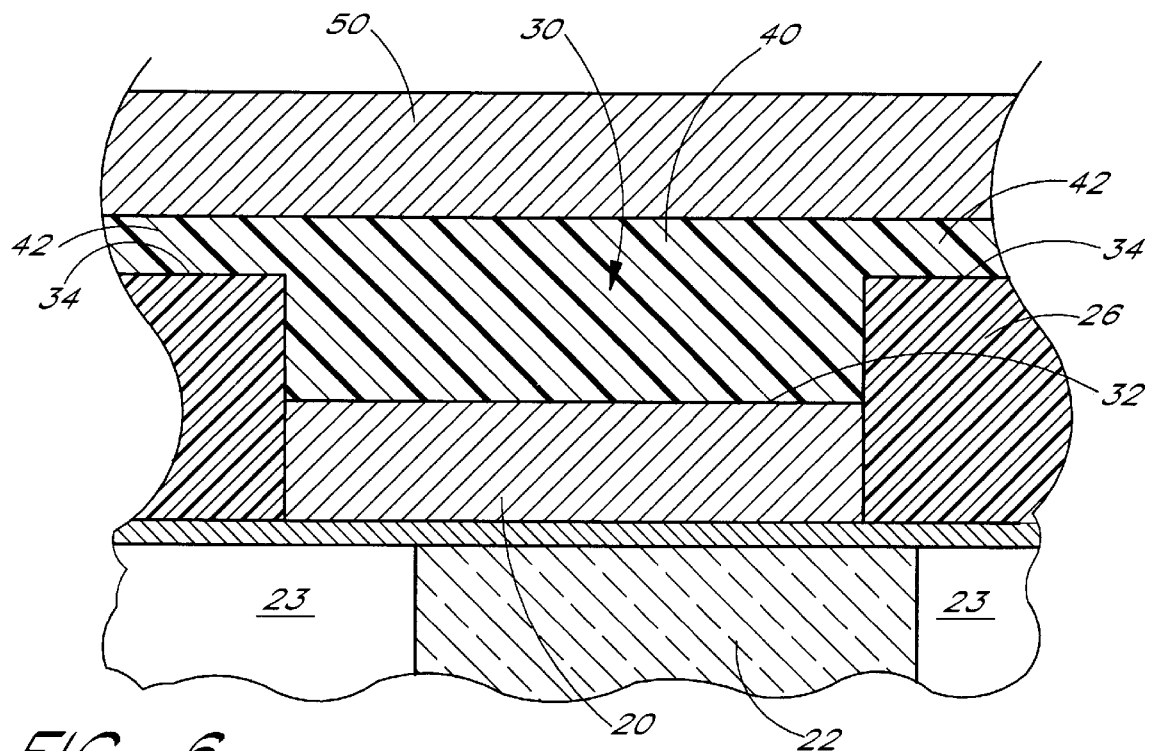
Figure 7:
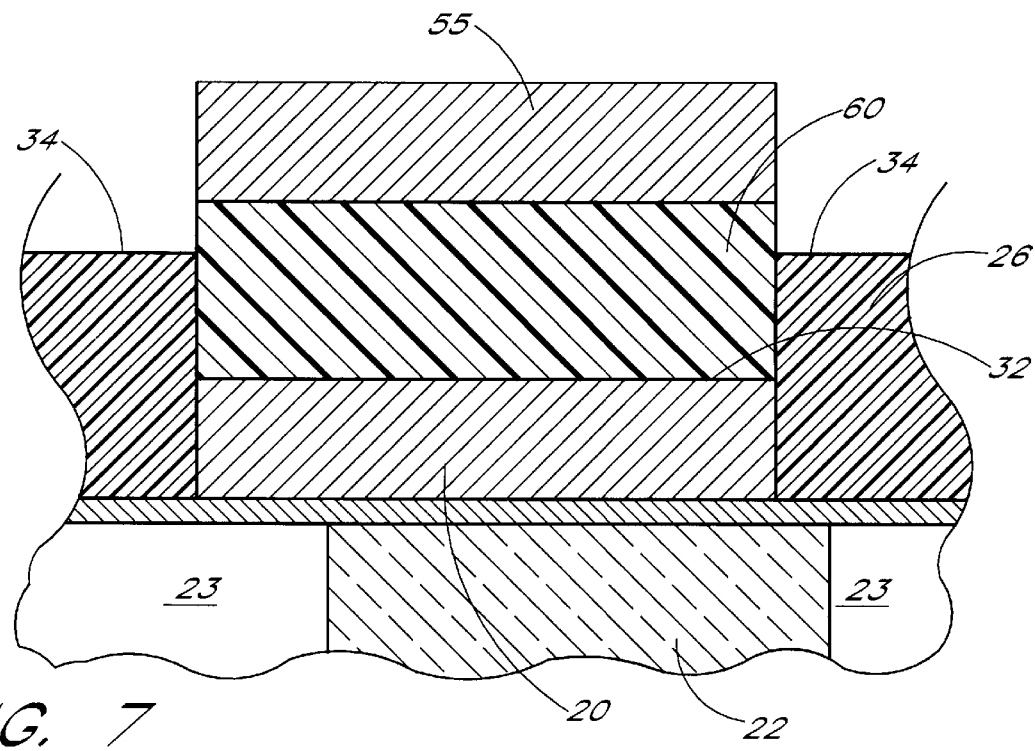

Thereafter, a top conductive layer 50 (FIG. 6) may be deposited over the dielectric layer 40. As with the bottom conductive layer, the top conductive layer 50 preferably comprises a non-reactive noble metal and most preferably platinum. Accordingly, it too may be patterned using the same mask used to pattern the bottom electrode 20 and etched using an ion milling process. Most preferably, a plasma beam of argon ions ($Ar^+$) is directed toward the masked wafer with high energy. A Veeco™ ion mill chamber may be employed for this etch, wherein argon gas is ionized and directed with a beam voltage of about 900 V at about 90° to the wafer surface while helium backside cooling is used to prevent damage to the wafer. As a result of such an etch, the top conductive layer 50 is patterned to form a top electrode 55 while the dielectric layer 40 is patterned to form a capacitor dielectric 60, as shown in FIG. 7.

In the preferred embodiment, the ion milling should also etch through any overflow portion 42 of the dielectric layer 40. Ideally, the process should etch the SBT of the preferred embodiment and stop at the underlying insulating layer 26. It has been found that ion milling may be controlled to do so with careful calibration. However, so long as a substantial portion of the capacitor dielectric 60 remains sheltered by the surrounding insulating layer 26, a slight overetch into the top surface 34 of the insulating layer is tolerable. Selectivity of the etch is therefore not critical to the present invention and conventional etching and timed stop techniques may be applied.

Alternatively, the overflow portion of the dielectric layer may be patterned and etched prior to deposition of the top conductive layer. The top conductive layer may then be deposited over the patterned dielectric and etched to form the top electrode. It will be understood that neither of these etches through an overflow portion of the dielectric layer 40 will be necessary for embodiments in which the dielectric layer 40 is deposited to just fill the contact via 30, or where there is a slight underfill of the via. For such embodiments, etching of a possibly unstable dielectric layer may be altogether avoided.

The above-described process and structure avoids many of the problems encountered in prior art capacitors incorporating high-$\epsilon$ dielectric materials. Due to the pre-patterned contact and dielectric fill, etching of the entire dielectric layer and its consequent destabilizing effect upon the volatile material are avoided. The preferred insulating layer 26, comprising silicon nitride, not only provides structural support for the high-$\epsilon$ layer, but also forms a relatively dense barrier. Thus, the silicon nitride of the preferred insulating layer 26 effectively protects the dielectric layer 40 from undue exposure to harmful etch processes, while forming an effective barrier against oxygen diffusion during dielectric deposition, solvent evolution and especially during crystallization of the high-$\epsilon$ dielectric material.

Furthermore, the preferred process, incorporating a spin-on dielectric deposition, results in a planar layer, giving the memory cell sharp switching characteristics at the same time as avoiding mechanical stresses in the dielectric.

After the structure of FIG. 7 has been formed, the integrated circuit may be completed by conventional processing. For example, a planarized oxide layer may be deposited and contacts formed to metal lines or other interconnects.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

What is claimed is:

1. A method of forming a capacitor in an integrated circuit, the method comprising the steps of:

forming a bottom electrode in electrical contact with a circuit node of the integrated circuit;

forming a silicon nitride layer over and in direct contact with the bottom electrode;

forming a contact via through the silicon nitride layer to at least partially expose the bottom electrode;

depositing a dielectric material into the contact via, the dielectric material characterized by a dielectric constant of greater than about 100; and forming a top electrode over the dielectric material.

2. The method of claim 1, wherein the dielectric material comprises a form of strontium bismuth tantalate.

3. The method of claim 2, wherein the dielectric material comprises a material having the chemical formula $SrBi_2Ta_2O_9$.

4. The method of claim 2, wherein the dielectric depositing step comprises a spin-on deposition.

5. The method of claim 4, wherein the spin-on deposition is conducted at a rotation rate of between 500 and 5,000 rpm with a dielectric material solution having a molarity between 0.1 and 0.3 molar in a xylene solvent, and the deposited dielectric material has a thickness between about 500 and 5,000 Å.

6. The method of claim 4, wherein the dielectric deposition step further comprises a crystallization step.

7. The method of claim 6, wherein the dielectric deposition step further comprises a solvent evolution step prior to the crystallization step.

8. The method of claim 7, wherein the solvent evolution step comprises a heating step at between about 100° C. and 550° C. and the crystallization step comprises a heating step at between about 450° C. and 950° C.

9. The method of claim 1, wherein the top electrode forming step comprises depositing a top conductive layer over the dielectric material and pattern etching the top conductive layer.

10. The method of claim 9, wherein the pattern etching step comprises an argon plasma etch.

11. The method of claim 9, wherein the dielectric material depositing step comprises depositing an overflow portion having a thickness of between about 0 and 1,000 Å, and the pattern etching step further comprises the step of etching through the overflow portion.

12. The method of claim 1, wherein the silicon nitride forming step comprises a chemical vapor deposition (CVD).

13. The method of claim 12, wherein the CVD comprises a low pressure CVD.

14. The method of claim 13, wherein the low pressure CVD comprises reacting silane and ammonia at between about 700° C. and 900° C.

15. The method of claim 14, wherein the contact via formation step comprises a fluorocarbon etch through a negative mask.

16. The method of claim 1, wherein the bottom and top electrodes comprise platinum.

17. A method of forming a capacitor in an integrated circuit, the method comprising:

forming a contact via through an insulating diffusion barrier layer, the via having a bottom surface comprising an exposed upper surface of a bottom electrode and having sidewalls formed of said diffusion barrier layer;

depositing a dielectric layer into the contact via to contact and cover the exposed upper surface of the bottom electrode; and depositing a top conductive layer over the dielectric layer within the contact via.

18. The method of claim 17, wherein the diffusion barrier layer comprises a silicon nitride layer.

19. The method of claim 18, wherein the diffusion barrier layer comprises an LPCVD silicon nitride layer.

20. The method of claim 18, wherein the dielectric layer deposition step comprises filling the contact via with a dielectric material having a dielectric constant greater than 100 and overflowing the contact via.

21. The method of claim 18, wherein the dielectric layer deposition step comprises a spin-on of a solution of strontium bismuth tantalate and a high temperature crystallization step.

22. The method of claim 18, wherein the top conductive layer comprises a noble metal.

23. The method, of claim 18, further comprising the steps of masking a portion of the top conductive layer overlying the contact via and etching with an ion milling process.

24. The method of claim 23, wherein the ion milling process etches both the top conductive layer and a portion of the dielectric layer outside of the contact via.

25. A method of forming a patterned capacitor dielectric for an integrated circuit capacitor, the method comprising:

forming a via through a silicon nitride layer; and at least completely filling the via with a dielectric material characterized by a dielectric constant of at least about 100.

26. The method of claim 25, further comprising etching only a portion of the dielectric material overflowing the contact.

* * * * *